United States Patent
Kim (10) Patent No.: US 12,225,776 B2
(45) Date of Patent: Feb. 11, 2025

(54) DISPLAY PANEL AND MANUFACTURING METHOD THEREOF

(71) Applicant: LG DISPLAY CO., LTD., Seoul (KR)

(72) Inventor: Kanghyun Kim, Paju-si (KR)

(73) Assignee: LG Display Co., Ltd. (KR)

( * ) Notice: Subject to any disclaimer, the term of this patent is extended or adjusted under 35 U.S.C. 154(b) by 483 days.

(21) Appl. No.: 17/547,359

(22) Filed: Dec. 10, 2021

(65) Prior Publication Data
US 2022/0208905 A1 Jun. 30, 2022

(30) Foreign Application Priority Data

Dec. 31, 2020 (KR) .......................... 10-2020-0189651

(51) Int. Cl.
*H10K 59/122* (2023.01)
*H10K 59/35* (2023.01)
*H10K 59/12* (2023.01)

(52) U.S. Cl.
CPC ......... *H10K 59/122* (2023.02); *H10K 59/353* (2023.02); *H10K 59/1201* (2023.02)

(58) Field of Classification Search
CPC ............... H10K 59/122; H10K 59/353; H10K 59/1201; H10K 59/35; H10K 71/135
See application file for complete search history.

(56) References Cited

U.S. PATENT DOCUMENTS

| | | | | |
|---|---|---|---|---|
| 2013/0328049 A1* | 12/2013 | Choi | .................. | H01L 29/7869 |
| | | | | 257/E21.414 |
| 2017/0005149 A1* | 1/2017 | Park | .................. | H10K 59/1213 |
| 2019/0181204 A1* | 6/2019 | Kim | .................. | H10K 59/122 |
| 2021/0359042 A1* | 11/2021 | Hou | .................. | H10K 59/122 |

FOREIGN PATENT DOCUMENTS

| | | | |
|---|---|---|---|
| EP | 0989778 A1 | * | 3/2000 |
| KR | 20160031656 A | * | 3/2016 |
| KR | 2020-0031418 A | | 3/2020 |

\* cited by examiner

*Primary Examiner* — Sitaramarao S Yechuri
(74) *Attorney, Agent, or Firm* — Fish & Richardson P.C.

(57) ABSTRACT

A display panel includes: a substrate on which pixels are disposed; a bank which defines a light emitting area of the pixels; a light emitting layer formed in the light emitting area, the bank includes: a hydrophilic bank which extends in a row direction and separates pixel rows; a first hydrophobic bank which is formed on the hydrophilic bank; and a second hydrophobic bank which extends in a column direction and separates pixel columns, and the first hydrophobic bank has a lower hydrophobic property than that of the second hydrophobic bank.

18 Claims, 10 Drawing Sheets

DISPLAY PANEL AND MANUFACTURING METHOD THEREOF

CROSS-REFERENCE TO RELATED APPLICATION

The present application claims the priority of Korean Patent Application No. 10-2020-0189651, filed Dec. 31, 2020, which is hereby incorporated by reference in its entirety or all purposes.

BACKGROUND

Field of the Disclosure

The present disclosure relates to a display panel and a manufacturing method thereof.

Description of the Background

With the development of information-oriented society, various types of display devices are being developed. Among a variety of display devices, a liquid crystal display (LCD) and an organic light emitting display (OLED) are currently in the market.

An organic light emitting device constituting the OLED emits light by itself without a separate light source, and thus, the OLED can be thinner and lighter than other display device. Also, the OLED shows high quality characteristics such as a low power consumption, a high luminance, and a fast response speed, etc.

Recently, a technology for forming a light emitting layer of an organic light emitting device through a solution process using an inkjet apparatus is being developed. The solution process is performed by applying a solution for forming a light emitting layer on a set region and then drying the solution.

SUMMARY

The present disclosure is to provide a display panel capable of eliminating a thickness deviation of a light emitting layer of an organic light emitting device manufactured when using a solution process and capable of improving flatness, and a manufacturing method thereof.

More specifically, the present disclosure is to provide a display panel includes a hydrophilic bank, a first hydrophobic bank formed on the hydrophilic bank, and a second hydrophobic bank formed on the first hydrophobic bank. The first hydrophobic bank has a lower hydrophobic property than that of the second hydrophobic bank.

An aspect of the present disclosure includes is a display panel including a substrate on which pixels are disposed; a bank which defines a light emitting area of the pixels; a light emitting layer formed in the light emitting area, the bank includes a hydrophilic bank which extends in a row direction and separates pixel rows; a first hydrophobic bank which is formed on the hydrophilic bank; and a second hydrophobic bank which extends in a column direction and separates pixel columns, and the first hydrophobic bank has a lower hydrophobic property than that of the second hydrophobic bank.

The second hydrophobic bank is formed to cover a region of the first hydrophobic bank in a region where the first hydrophobic bank and the second hydrophobic bank cross.

The hydrophilic bank and the first hydrophobic bank have a grid shape which further extends in the column direction.

A surface of an edge region of the light emitting layer, which is in contact with the bank, is formed higher than a surface of a central region of the light emitting layer.

A contact angle between the light emitting layer and the bank is formed generally uniformly at the edge region of the light emitting layer.

A thickness of the first hydrophobic bank is less than a thickness of the second hydrophobic bank.

The first hydrophobic bank and the second hydrophobic bank are made of an organic insulator and include a hydrophobic material disposed on a portion of a surface thereof. An amount of the hydrophobic material of the first hydrophobic bank is less than an amount of the hydrophobic material of the second hydrophobic bank.

Another aspect is a manufacturing method of the display panel. The manufacturing method includes: forming a hydrophilic bank which extends on a substrate in a row direction and separates pixel rows; forming a first hydrophobic bank on the hydrophilic bank; and forming a second hydrophobic bank which extends in a column direction and separates pixel columns. The first hydrophobic bank has a lower hydrophobic property than that of the second hydrophobic bank.

The forming the hydrophilic bank further includes forming, in the form of a grid, the hydrophilic bank which further extends in the column direction.

The forming the first hydrophobic bank and the forming the second hydrophobic bank include: applying a solution in which a hydrophobic material is mixed with a hydrophilic organic insulator; and drying the solution.

The drying the solution is performed by a photolithography process. An amount of light which is irradiated in the photolithography process for forming the first hydrophobic bank is less than an amount of light which is irradiated in the photolithography process for forming the second hydrophobic bank.

A thickness of the first hydrophobic bank is less than a thickness of the second hydrophobic bank.

An amount of the hydrophobic material of the solution for forming the first hydrophobic bank is less than an amount of the hydrophobic material of the solution for forming the second hydrophobic bank.

The drying the solution is performed by an extreme ultraviolet treatment. A degree of the extreme ultraviolet treatment for forming the first hydrophobic bank is less than a degree of the extreme ultraviolet treatment for forming the second hydrophobic bank.

The manufacturing method further includes: applying a solution of a mixture of a solvent and an organic material on a light emitting area surrounded by the first hydrophobic bank and the second hydrophobic bank; and forming a light emitting layer by hardening the solution.

The solution is continuously applied along each of the pixel columns while covering the first hydrophobic bank, and is separated from each other between the pixel columns by the second hydrophobic bank.

A height of a surface of the solution is reduced as the solution is hardened, so that the solution is separated from each other between the pixel rows by the first hydrophobic bank.

After the solution is hardened, a contact angle between a surface of the light emitting layer and the first hydrophobic bank is largely similar to a contact angle between the surface of the light emitting layer and the second hydrophobic bank.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Hereinafter, aspects of the present disclosure will be described with reference to the accompanying drawings. In this specification, when it is mentioned that a component (or region, layer, portion) "is on", "is connected to", or "is combined with" another component, terms "is on", "connected to", or "combined with" mean that a component may be directly connected to/combined with another component or mean that a third component may be disposed between them.

The same reference numerals correspond to the same components. Also, in the drawings, the thicknesses, ratios, and dimensions of the components are exaggerated for effective description of the technical details. A term "and/or" includes all of one or more combinations that related configurations can define.

While terms such as the first and the second, etc., can be used to describe various components, the components are not limited by the terms mentioned above. The terms are used only for distinguishing between one component and other components. For example, the first component may be designated as the second component without departing from the scope of rights of various aspects. Similarly, the second component may be designated as the first component. An expression of a singular form includes the expression of plural form thereof unless otherwise explicitly mentioned in the context.

Terms such as "below", "lower", "above", "upper" and the like are used to describe the relationships between the components shown in the drawings. These terms have relative concepts and are described based on directions indicated in the drawings.

In the present specification, it should be understood that the term "include" or "comprise" and the like is intended to specify characteristics, numbers, steps, operations, components, parts or any combination thereof which are mentioned in the specification, and intended not to previously exclude the possibility of existence or addition of at least one another characteristics, numbers, steps, operations, components, parts or any combination thereof.

Figure 1:
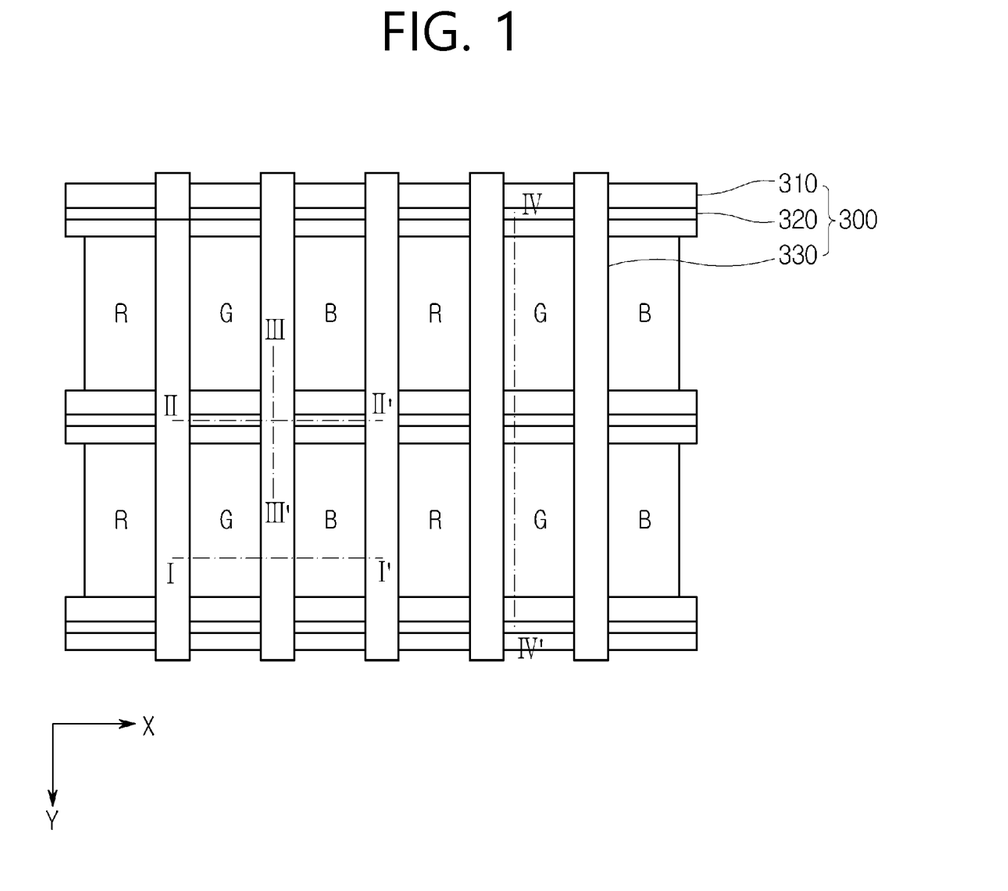
FIG. 1 is a schematic plan view of a region of a display panel.

FIG. 1 is a schematic plan view of a region of a display panel.

Referring to FIG. 1, the display panel may include pixels R, G, and B which represent one of a first to a third colors. For example, the pixels R, G, and B may include first pixels R representing a red color, second pixels G representing a green color, and third pixels B representing a blue color. Here, pixels representing the same color may be disposed in one pixel column on the display panel. For example, the first pixels R may be disposed in a first pixel column, the second pixels G may be disposed in a second pixel column, and the third pixels B may be disposed in a third pixel column.

Each of the pixels R, G, and B may include a light emitting device and circuit elements for driving the light emitting device.

A bank 300 may be arranged to define light emitting areas of the pixels R, G, and B.

In the aspect, the bank 300 may include at least three types of banks 310, 320, and 330 having hydrophilicity and/or hydrophobicity. For example, the bank 300 may include the hydrophilic bank 310, the first hydrophobic bank 320 formed on the hydrophilic bank 310, and the second hydrophobic bank 330 formed on the first hydrophobic bank 320.

The hydrophilic bank 310 has a hydrophilic property. For example, the hydrophilic bank 310 may be formed of an inorganic insulating material such as silicon oxide.

In the aspect, the hydrophilic bank 310 may be a defining layer that separates the pixels R, G, and B. In this aspect, the hydrophilic bank 310 has a grid structure extending in a row direction X and in a column direction Y.

In another aspect, the hydrophilic bank 310 may be a defining layer that separates pixel rows. In this aspect, the hydrophilic bank 310 extends between the pixel rows in the row direction X.

The first hydrophobic bank 320 is formed on the hydrophilic bank 310. At least one region of the first hydrophobic bank 320 has a low hydrophobic property.

At least one region of the second hydrophobic bank 330 has a hydrophobic property. Here, the second hydrophobic bank 330 has a higher hydrophobic property than that of the first hydrophobic bank 320. The second hydrophobic bank 330 may be a defining layer that separates the pixel columns. In this aspect, the second hydrophobic bank 330 extends between the pixel columns in the column direction Y.

Hereinafter, a structure of the display panel will be described in more detail with reference to a cross sectional view of the display panel.

Figure 2:
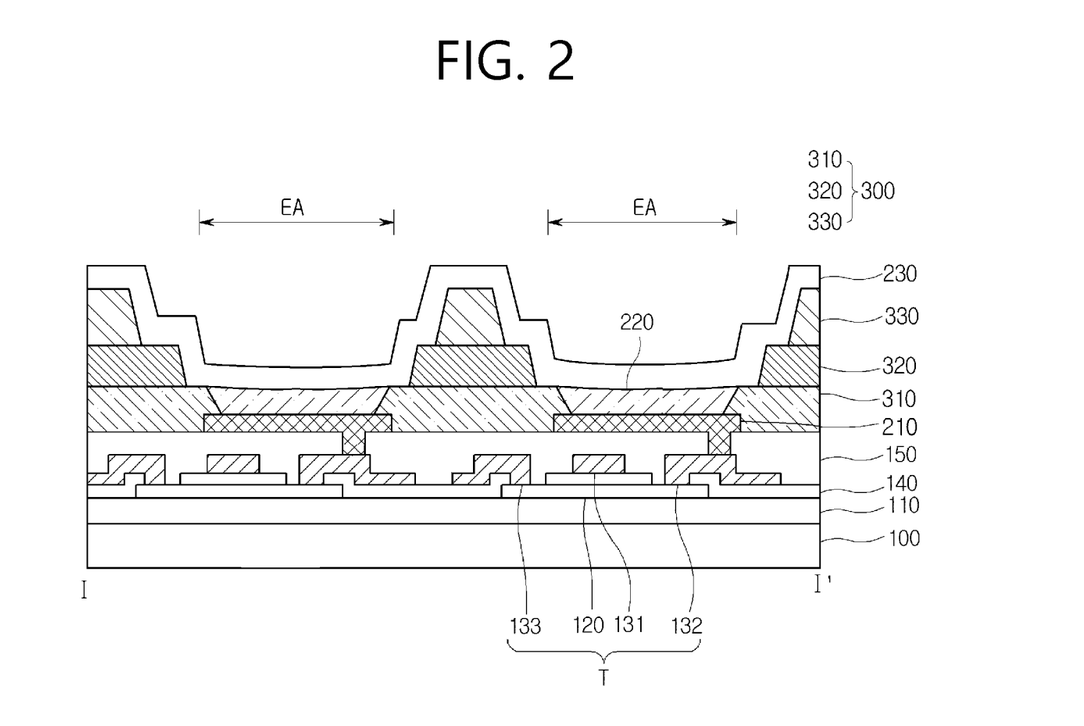
FIG. 2 shows an aspect of a cross-sectional view taken along line I-I' of FIG. 1.

FIG. 2 shows an aspect of a cross-sectional view taken along line I-I' of FIG. 1.

Referring to FIG. 2, the display panel includes a substrate 100 on which the pixels are disposed, a circuit element layer which is disposed on the substrate 100 and on which circuit elements for driving pixels are disposed, and a light emitting device layer which is disposed on the circuit element layer and on which light emitting devices of the pixels are disposed.

The substrate 100 is a base material and may be a light-transmitting substrate. The substrate 100 may be a rigid substrate including glass or tempered glass or a flexible substrate made of plastic.

A buffer layer 110 is formed on the substrate 100. The buffer layer 110 can prevent diffusion of ions or impurities from the substrate 100 and block moisture penetration.

An active layer 120 is formed on the buffer layer 110. The active layer 120 may be formed of a silicon-based semiconductor material or an oxide-based semiconductor material. The active layer 120 may include a source region and a drain region which include p-type or n-type impurities, and a channel formed between the source region and the drain region.

A conductive layer is formed on the active layer 120. The conductive layer may include a gate electrode 131 disposed to overlap the channel region of the active layer 120, and a source electrode 132 and a drain electrode 133 which are connected to the source and drain regions of the active layer 120, respectively. The gate electrode 131, the source electrode 132, the drain electrode 133, and the active layer 120 corresponding thereto may constitute a transistor T.

An insulating layer 140 may be interposed between the active layer 120 and the conductive layer. The insulating layer 140 may be a silicon oxide (SiOx), a silicon nitride (SiNx), or a multilayer thereof.

An overcoat layer 150 may be formed on the conductive layer. The overcoat layer 150 may be a planarization layer for reducing a step difference in the structure thereunder. According to the aspect, an insulating layer (e.g., a protective layer) for protecting the devices thereunder may be further formed between the conductive layer and the overcoat layer 150.

The light emitting device is formed on the overcoat layer 150 and having an edge region thicker than a central region. In the aspect, the light emitting device may include a first electrode 210, a light emitting layer 220, and a second electrode 230. The first electrode 210 may be an anode electrode and the second electrode 230 may be a cathode electrode.

The first electrode 210 is formed on the overcoat layer 150. The first electrode 210 may be connected, through a contact hole which passes through the overcoat layer 150, to the circuit elements disposed under the overcoat layer 150. In the aspect, the first electrode 210 may be formed as a triple layer including a transparent conductive layer/a reflective layer/a transparent conductive layer.

The bank 300 may be formed on the first electrode 210. The bank 300 may be a defining layer which defines a light emitting area EA of the pixels R, G, and B. The bank 300 is formed to cover a portion of the edge of the first electrode 210, and the exposed region of the first electrode 210 which is not covered by the bank 300 can be defined as the light emitting area EA of the pixels R, G, and B. The first electrode 210, the light emitting layer 220, and the second electrode 230 are stacked within the light emitting area EA such that they are in direct contact with each other.

In FIG. 2, the bank 300 may include at least three types of banks 310, 320, and 330 having hydrophilicity and/or hydrophobicity. For example, the bank 300 may include the hydrophilic bank 310, the first hydrophobic bank 320 formed on the hydrophilic bank 310, and the second hydrophobic bank 330 formed on the first hydrophobic bank 320.

The hydrophilic bank 310 has a hydrophilic property. For example, the hydrophilic bank 310 may be formed of an inorganic insulating material such as silicon oxide.

In the aspect, the hydrophilic bank 310 surrounds the respective light emitting areas EA. That is, the hydrophilic bank 310 has a grid shape which extends between the pixel rows in the row direction X and extends between the pixel columns in the column direction Y. Here, the hydrophilic bank 310 may be disposed to cover a portion of the edge of the first electrode 210 of each of the pixels R, G, and B. In the aspect, the hydrophilic bank 310 may have a tapered side surface.

Since the hydrophilic bank 310 has a hydrophilic property, when a solution for forming the light emitting layer 220 is applied on the bank 300, the solution can easily spread along a sidewall of the hydrophilic bank 310.

The first hydrophobic bank 320 is formed on the hydrophilic bank 310. The first hydrophobic bank 320 is formed in the form of a grid between the pixel rows and pixel columns of the grid along the hydrophilic bank 310.

At least one region of the first hydrophobic bank 320 has a low hydrophobic property. In the aspect, the first hydrophobic bank 320 may be patterned by applying a solution in which a hydrophobic material such as fluorine is mixed with a hydrophilic organic insulator and then by drying the solution through a photolithography process. The hydrophobic material such as fluorine can move to the top of the first hydrophobic bank 320 and is disposed by light irradiated during the photolithography process, and the top surface of the first hydrophobic bank 320 may have a hydrophobic property. However, the present aspect is not limited thereto, and the entire portion of the first hydrophobic bank 320 may be formed to have a hydrophobic property.

In the aspect, the first hydrophobic bank 320 may have a tapered side surface. The first hydrophobic bank 320 may be formed to have a narrower width than that of the hydrophilic bank 310.

The first hydrophobic bank 320 has a low hydrophobic property. Therefore, when the solution for forming the light emitting layer 220 is applied on the bank 300, the solution can be continuously applied while covering the first hydrophobic bank 320, without being separated between the pixel columns. The applied solution can then be dried during a hardening process. During drying, the solution is shrunk by a dewetting phenomenon and thus can be separated from each other between the pixel columns. The shape change according to the hardening process of the solution will be described in more detail below with reference to FIGS. 12 to 18.

At least one region of the second hydrophobic bank 330 has a hydrophobic property. Here, the second hydrophobic bank 330 has a higher hydrophobic property than that of the first hydrophobic bank 320. A method for controlling the hydrophobicity between the first hydrophobic bank 320 and the second hydrophobic bank 330 will be described in detail below with reference to FIGS. 8 to 11.

As described with reference to FIG. 1, the second hydrophobic bank 330 may be a defining layer that separates the pixel columns. In this aspect, the second hydrophobic bank 330 extends between the pixel columns in the column direction Y.

When the solution for forming the light emitting layer 220 is applied on the display panel, the solution is separated from each other between the pixel columns by the second hydrophobic bank 330. Accordingly, the second hydrophobic bank 330 can prevent color mixing between the pixel columns.

The second hydrophobic bank 330 may have a tapered side surface. As the second hydrophobic bank 330 has a tapered shape, the solution can be more effectively separated between adjacent pixel columns, so that the solution can be prevented from being mixed.

The light emitting layer 220 is formed on the first electrode 210. The light emitting layer 220 is formed on some region of the first electrode 210 which is exposed without being covered by the bank 300. That is, the light emitting layer 220 may be formed in the light emitting area EA defined by the bank 300.

The light emitting layer 220 may have a multilayer thin film structure including a light generating layer. For example, the light emitting layer 220 may include a hole transport layer (HTL), a light generating layer, and an electron transport layer (ETL). Also, the light emitting layer 220 may further include a hole injection layer (HIL), a hole blocking layer (HBL), an electron injection layer (EIL), and an electron blocking layer (EBL).

In the aspect, the light emitting layer 220 may be formed by a solution process using inkjet apparatus or the like. That is, the light emitting layer 220 may be formed by applying (dropping) an organic light emitting material, for example, a solution to a region surrounded by the bank 300, and drying the applied solution. The solution may be manufactured by mixing organic materials constituting the light emitting layer 220 with a solvent. The solution may be jetted to the light emitting area EA through an inkjet apparatus having a nozzle mounted on an inkjet head. The applied ink is dried to form the light emitting layer 220.

Here, the solution may be continuously applied along the pixel column in which the pixels R, G, and B of the same color are disposed. The applied solution can be dried through a hardening process. During drying, the solution is separated from each other between the pixel rows.

When the light emitting layer 220 is formed by the solution process, a difference in surface height may occur (pile-up) between a central region of the light emitting layer 220 and an edge region in contact with the bank 300 by a tension between the solution and the bank 300. For example, the light emitting layer 220 may be formed in a concave shape having the smallest thickness in its central portion and the largest thickness in its region which is in contact with the bank 300, and the surface of the edge region may be higher than the surface of the central region. Here, an angle between the side surface of the bank 300 and the surface of the light emitting layer 220 may be defined as a contact angle.

The second electrode 230 may be formed on the entire surface of the display panel. That is, the second electrode 230 may be formed to cover the bank 300 and the light emitting layer 220.

Figure 3:
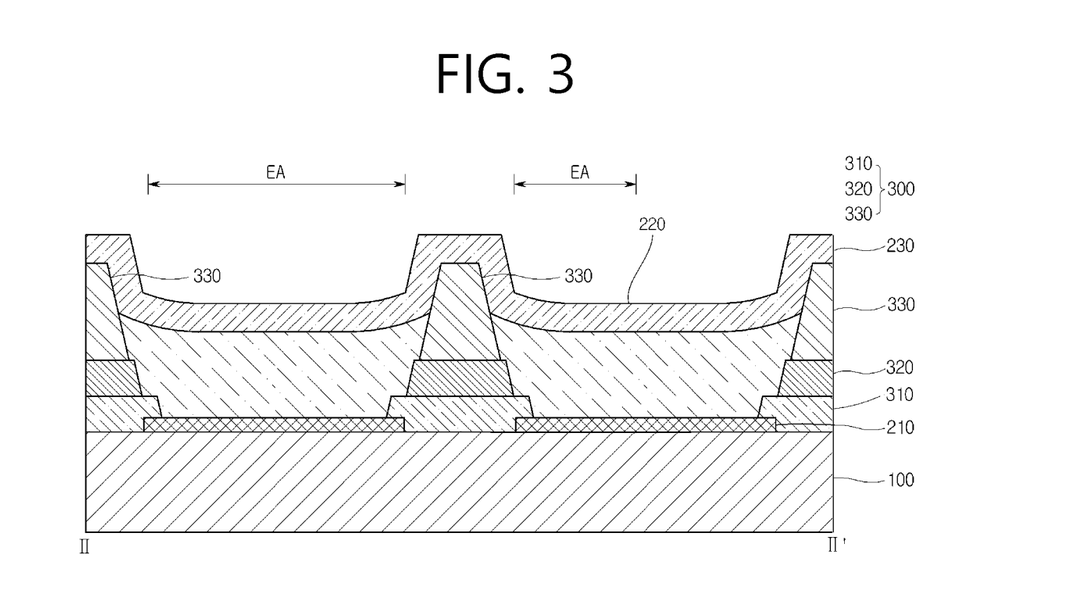
FIG. 3 shows an aspect of a cross-sectional view taken along line II-II' of FIG. 1.
Figure 4:
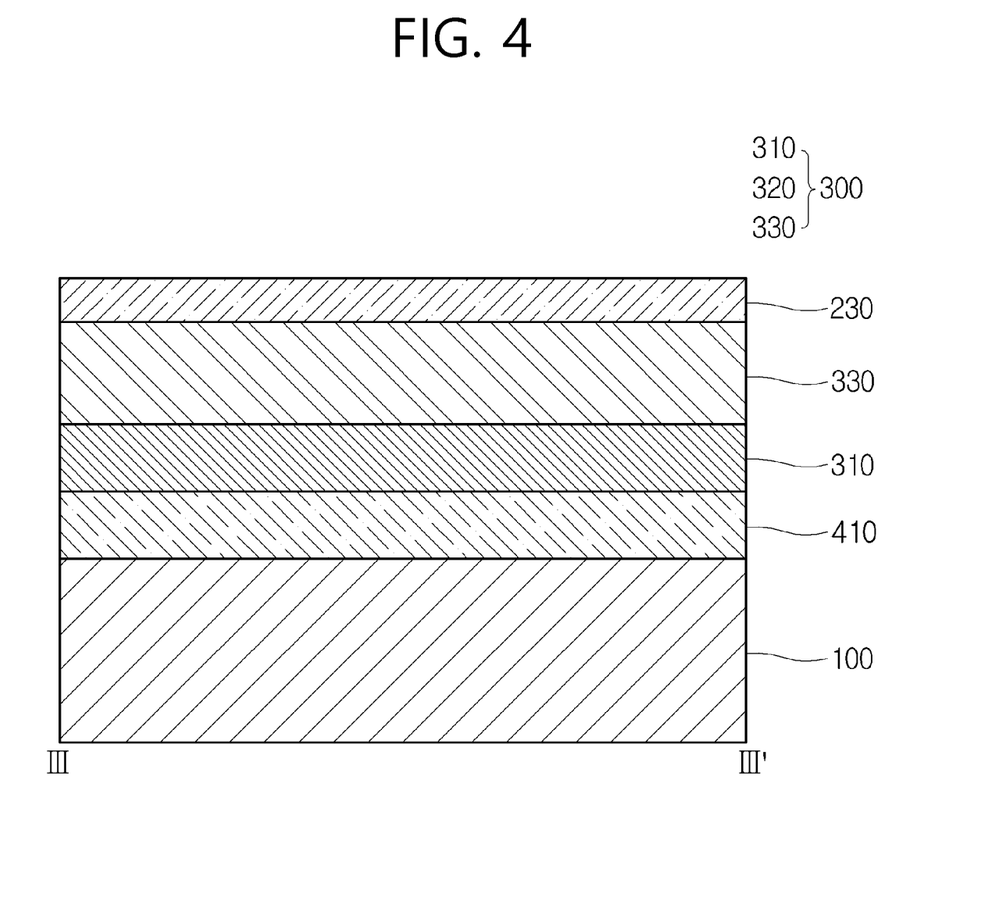
FIG. 4 shows an aspect of a cross-sectional view taken along line of FIG. 1.

FIG. 3 shows an aspect of a cross sectional view taken along line II-II' of FIG. 1, and FIG. 4 shows an aspect of a cross sectional view taken along line of FIG. 1. For convenience of description, FIGS. 3 and 4 show only the bank 300 on the substrate 100 and the layer on the bank 300.

In the aspect, the hydrophilic bank 310 and the first hydrophobic bank 320 extend in the form of a grid in the column direction Y and in the row direction X. The second hydrophobic bank 330 extends in the column direction Y.

Here, in a region where the first hydrophobic bank 320 and the second hydrophobic bank 330 cross, the second hydrophobic bank 330 is formed on the first hydrophobic bank 320, and is formed to cover a region of the first hydrophobic bank 320.

When the bank 300 is formed in a different structure on the circumference of the light emitting area EA, a tension between the edge region of the light emitting layer 220 and the bank 300 becomes different. Therefore, a non-uniform contact angle at the edge of the light emitting layer 200 may be formed. In general, the contact angle between the hydrophilic bank and the light emitting layer 220 is less than 10 degrees, and the contact angle between the high hydrophobic bank and the light emitting layer 220 is 45 degrees or more. When only the hydrophilic bank is formed on portion of the circumference of the light emitting area EA and the hydrophobic bank is formed on another portion of the circumference, the contact angle becomes different between a portion of the edge of the light emitting layer 220 and another portion of the edge and between the light emitting layer and the hydrophilic bank, so that the non-uniformity of the surface may be increased.

In the aspects described with reference to FIGS. 2 to 4, the hydrophobic bank (i.e., the first hydrophobic bank 320 and the second hydrophobic bank 330) is formed on the entire circumference of the light emitting area EA. The contact angle between the light emitting layer 220 and the first hydrophobic bank 320 having a low hydrophobic property may be controlled to be about 30 degrees. Then, the difference in the contact angle in the entire edge region of the light emitting layer 220 becomes smaller than when a portion of the circumference of the light emitting area EA is composed of only the hydrophilic bank 310. As such, in the aspect, it is possible to prevent the non-uniformity and asymmetry of the surface height of the light emitting layer 220.

Also, when a hydrophobic bank having a high hydrophobic property is formed between the pixel rows, the light emitting layer 220 may be discontinuously formed in the pixel column during the solution process. When the solution is individually applied on the light emitting area EA, the area of the light emitting layer 220 is reduced due to a dewetting phenomenon of the solution during the hardening process, so that the luminous efficiency may be reduced. In the aspect, since the first hydrophobic bank 320 disposed between the pixel rows has a low hydrophobic property, the solution can be continuously applied along the pixel column.

Figure 5:
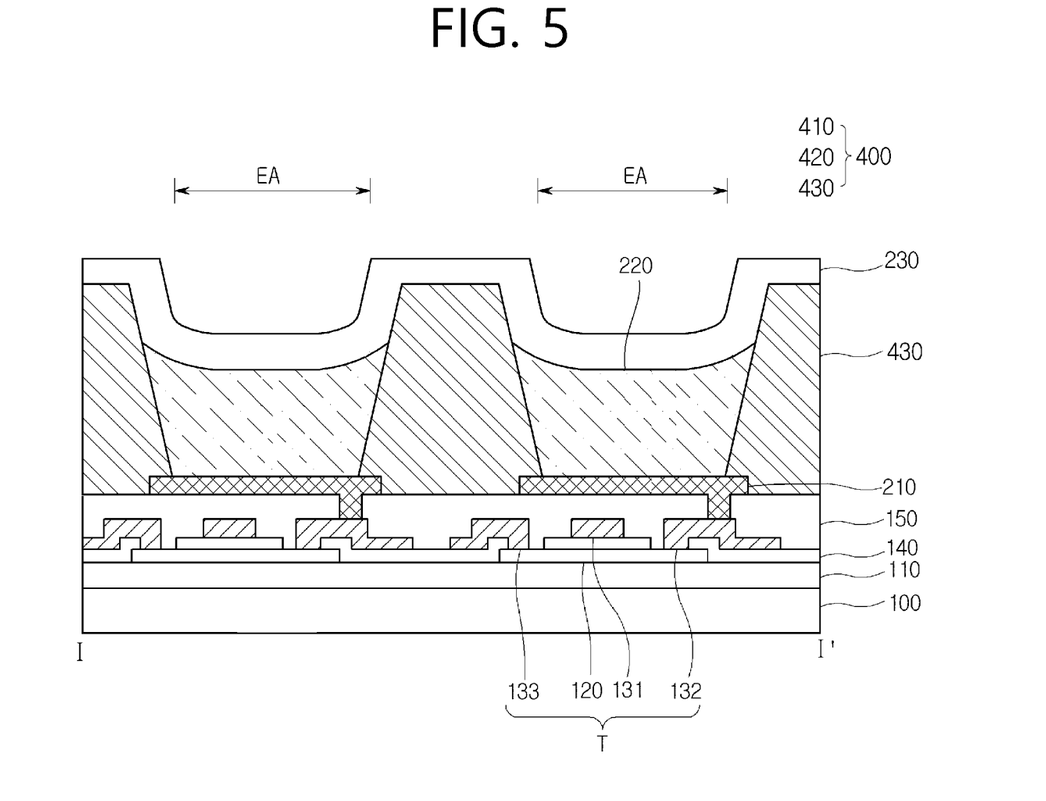
FIG. 5 shows another aspect of a cross-sectional view taken along line I-I' of FIG. 1.
Figure 6:
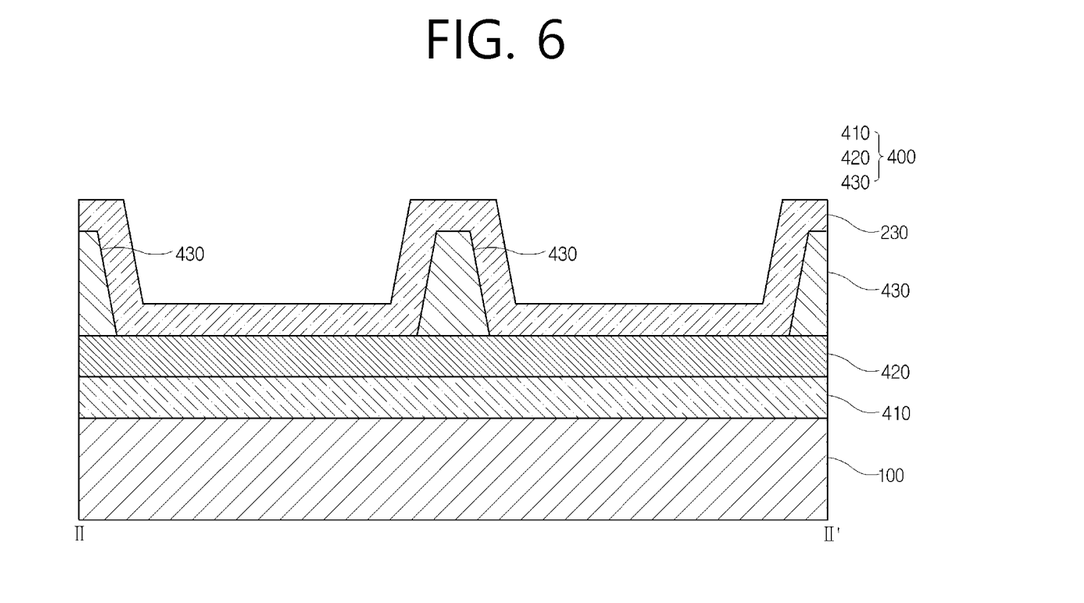
FIG. 6 shows another aspect of a cross-sectional view taken along line II-II' of FIG. 1.
Figure 7:
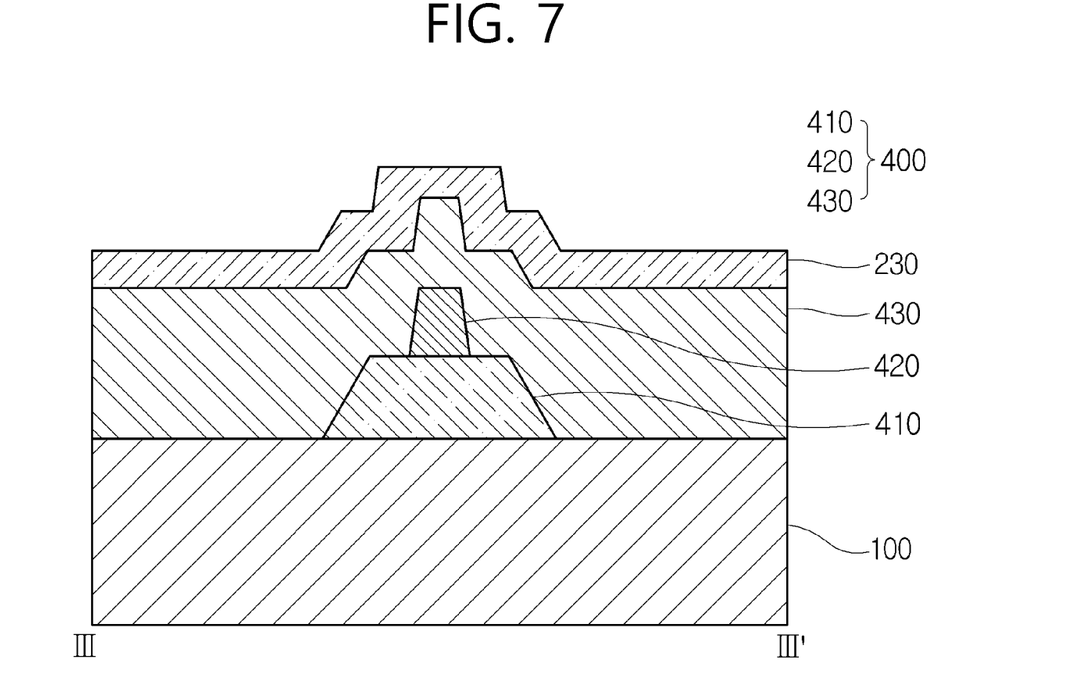
FIG. 7 shows another aspect of a cross-sectional view taken along line of FIG. 1.

FIGS. 5 to 7 are cross sectional views for describing another aspect different from the aspect of FIGS. 2 to 4. Here, since the schematic plan views of FIGS. 5 to 7 are the same as the schematic plan view of the aspect of FIG. 1, FIGS. 5 to 7 will be described by using the schematic plan view of FIG. 1.

FIG. 5 shows another aspect of a cross sectional view taken along line I-I' of FIG. 1.

Referring to FIG. 5, the display panel includes a substrate 100 on which the pixels are disposed, a circuit element layer which is disposed on the substrate 100 and on which circuit elements for driving pixels are disposed, and a light emitting device layer which is disposed on the circuit element layer and on which light emitting devices of the pixels are disposed.

The substrate 100 is a base material and may be a light-transmitting substrate. The substrate 100 may be a rigid substrate including glass or tempered glass or a flexible substrate made of plastic.

A buffer layer 110 is formed on the substrate 100. The buffer layer 110 can prevent diffusion of ions or impurities from the substrate 100 and block moisture penetration.

An active layer 120 is formed on the buffer layer 110. The active layer 120 may be formed of a silicon-based semiconductor material or an oxide-based semiconductor material. The active layer 120 may include a source region and a drain region which include p-type or n-type impurities, and a channel formed between the source region and the drain region.

A conductive layer is formed on the active layer 120. The conductive layer may include a gate electrode 131 disposed to overlap the channel region of the active layer 120, and a source electrode 132 and a drain electrode 133 which are connected to the source and drain regions of the active layer 120, respectively. The gate electrode 131, the source electrode 132, the drain electrode 133, and the active layer 120 corresponding thereto may constitute a transistor T.

An insulating layer 140 may be interposed between the active layer 120 and the conductive layer. The insulating layer 140 may be a silicon oxide (SiOx), a silicon nitride (SiNx), or a multilayer thereof.

An overcoat layer 150 may be formed on the conductive layer. The overcoat layer 150 may be a planarization layer for reducing a step difference in the structure thereunder. According to the aspect, an insulating layer (e.g., a protective layer) for protecting the devices thereunder may be further formed between the conductive layer and the overcoat layer 150.

The light emitting device layer is formed on the overcoat layer 150. The light emitting device layer includes light emitting devices. In the aspect, the light emitting device may include a first electrode 210, a light emitting layer 220, and a second electrode 230. The first electrode 210 may be an anode electrode and the second electrode 230 may be a cathode electrode.

The first electrode 210 is formed on the overcoat layer 150. The first electrode 210 may be connected, through a contact hole which passes through the overcoat layer 150, to the circuit elements disposed under the overcoat layer 150. In the aspect, the first electrode 210 may be formed as a triple layer including a transparent conductive layer/a reflective layer/a transparent conductive layer.

A bank 400 may be formed on the first electrode 210. The bank 400 may be a defining layer which defines a light emitting area EA of the pixels R, G, and B. The bank 400 is formed to cover a portion of the edge of the first electrode 210, and the exposed region of the first electrode 210 which is not covered by the bank 400 can be defined as the light emitting area EA of the pixels R, G, and B. The first electrode 210, the light emitting layer 220, and the second electrode 230 are stacked within the light emitting area EA such that they are in direct contact with each other.

In FIG. 5, the bank 400 may include a hydrophilic bank 410, a first hydrophobic bank 420 formed on the hydrophilic bank 410, and a second hydrophobic bank 430 formed on the first hydrophobic bank 420.

Compared with the aspect of FIG. 2, the bank 400 may be a defining layer which separates the pixel rows in FIG. 5. In this aspect, the hydrophilic bank 410 and the first hydrophobic bank 420 are formed to extend in a row direction X, not in the form of a grid. In the same manner as what is described with reference to FIG. 2, the second hydrophobic bank 430 extends in a column direction Y between the pixel columns.

The light emitting layer 220 is formed on the first electrode 210. The light emitting layer 220 is formed on some region of the first electrode 210 which is exposed without being covered by the bank 400. That is, the light emitting layer 220 may be formed in the light emitting area EA defined by the bank 400.

The light emitting layer 220 may have a multilayer thin film structure including a light generating layer. For example, the light emitting layer 220 may include a hole transport layer (HTL), a light generating layer, and an electron transport layer (ETL). Also, the light emitting layer 220 may further include a hole injection layer (HIL), a hole blocking layer (HBL), an electron injection layer (EIL), and an electron blocking layer (EBL).

In the aspect, the light emitting layer 220 may be formed by a solution process using inkjet apparatus or the like. That is, the light emitting layer 220 may be formed by applying (dropping) an organic light emitting material, for example, a solution to a region surrounded by the bank 400, and drying the applied solution. The solution may be manufactured by mixing organic materials constituting the light emitting layer 220 with a solvent. The solution may be jetted to the light emitting area EA through an inkjet apparatus having a nozzle mounted on an inkjet head. The applied ink is dried to form the light emitting layer 220.

Here, the solution may be continuously applied along the pixel column in which the pixels R, G, and B of the same color are disposed. The applied solution can be dried through a hardening process. During drying, the solution is separated from each other between the pixel rows.

When the light emitting layer 220 is formed by the solution process, a difference in surface height may occur (pile-up) between a central region of the light emitting layer 220 and an edge region in contact with the bank 400 by a tension between the solution and the bank 400. For example, the light emitting layer 220 may be formed in a concave shape having the smallest thickness in its central portion and the largest thickness in its region which is in contact with the bank 400, and the surface of the edge region may be higher than the surface of the central region.

The second electrode 230 may be formed on the entire surface of the display panel. That is, the second electrode 230 may be formed to cover the bank 400 and the light emitting layer 220.

FIG. 6 shows another aspect of a cross sectional view taken along line II-II' of FIG. 1. FIG. 7 shows another aspect of a cross sectional view taken along line of FIG. 1. For convenience of description, FIGS. 6 and 7 show only the bank 400 on the substrate 100 and the layer on the bank 400.

In the aspect, the hydrophilic bank 410 and the first hydrophobic bank 420 extend in the column direction Y. The second hydrophobic bank 430 extends in the column direction Y.

The second hydrophobic bank 430 is formed on the first hydrophobic bank 420 in a region where the first hydrophobic bank 420 and the second hydrophobic bank 430 cross and in a region where the first hydrophobic bank 420 and the second hydrophobic bank 430 do not cross.

FIGS. 8 to 11 are views for describing methods for controlling the contact angle between the hydrophobic bank and the light emitting layer. In FIGS. 8 to 11, for example, propylene glycol methyl ether acetate (PGMEA, 1-methoxy-2-propanol acetate) is used as a photoresist, and the present disclosure is not limited thereto. It is also shown that a change in the contact angle between the bank and the surface of the light emitting layer 220 when various conditions are changed.

As described above, in the aspects, the first hydrophobic bank 320 has a lower hydrophobic property, and the second hydrophobic bank 330 has a higher hydrophobic property than that of the first hydrophobic bank 320. In order to control the hydrophobic intensity of the first hydrophobic bank 320 and the second hydrophobic bank 330 and/or the contact angle between the hydrophobic banks 320 and 330 and the light emitting layer 220, at least one of the amount of light (dose) in the photolithography process, a thickness of the hydrophobic banks 320 and 330, an amount of a hydrophobic material (e.g., fluorine) used as a material of the hydrophobic banks 320 and 330, and a degree of an extreme ultraviolet (EUV) treatment can be controlled.

Figure 8:
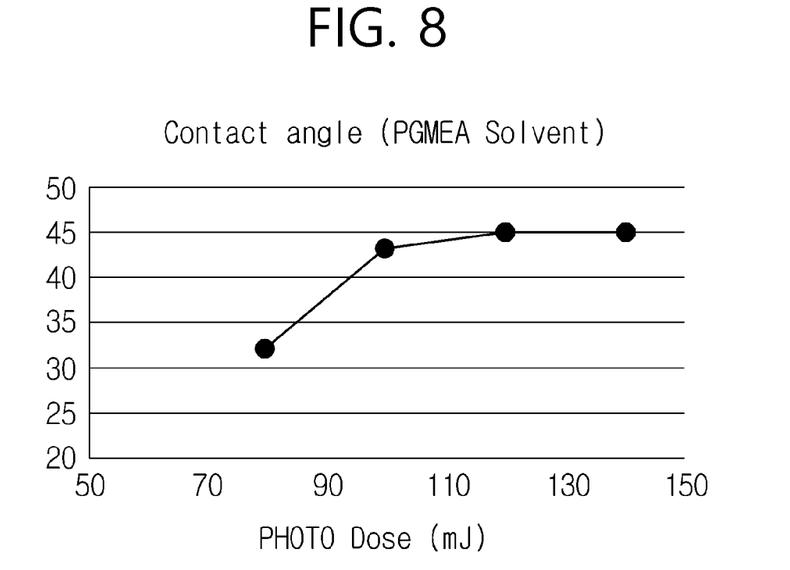
FIGS. 8 to 11 are views for describing methods for controlling a contact angle between a hydrophobic bank and a light emitting layer.

For example, in order to form the hydrophobic banks 320 and 330, a solution in which a hydrophobic material such as fluorine is mixed with a hydrophilic organic insulator is applied on the overcoat layer 150, and then a photolithography process is performed. Referring to FIG. 8, if a large amount of light is irradiated to the photoresist during the photolithography process, the hydrophobicity increases, and thus, the contact angle between the light emitting layer 220 and the hydrophobic banks 320 and 330 increases. Conversely, if a small amount of light is irradiated to the photoresist during the photolithography process, the hydrophobicity decreases, and thus, the contact angle between the light emitting layer 220 and the hydrophobic banks 320 and 330 decreases. Accordingly, a relatively small amount of light is irradiated during the photolithography process for forming the first hydrophobic bank 320, and a relatively large amount of light is irradiated during the photolithography process for forming the second hydrophobic bank 330. Accordingly, the hydrophobic intensity between the hydrophobic banks 320 and 330 can be controlled.

Figure 9:
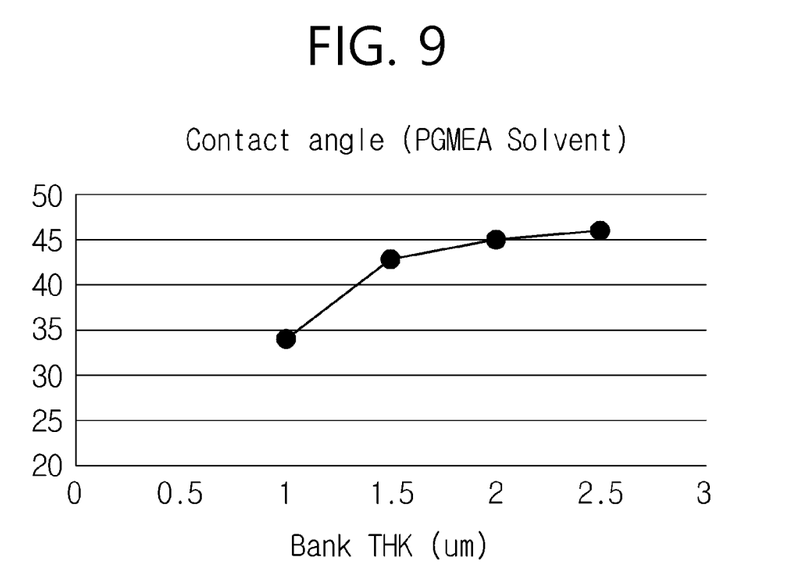

Referring to FIG. 9, when the hydrophobic banks 320 and 330 have a large thickness THK, the contact angle between the hydrophobic banks 320 and 330 and the light emitting layer 220 increases, and when the hydrophobic banks 320 and 330 have a small thickness, the contact angle between the hydrophobic banks 320 and 330 and the light emitting layer 220 decreases. Accordingly, while the solution for forming the light emitting layer 220 is continuously applied within the pixel column by controlling the thickness of the first hydrophobic bank 320, the thickness of the first hydrophobic bank 320 can be controlled such that there is no big difference between the contact angle between the second hydrophobic bank 330 and the light emitting layer 220 and the contact angle between the first hydrophobic bank 320 and the light emitting layer 220.

In the aspect, the thickness of the first hydrophobic bank 320 may be less than about 5 and is not limited thereto.

Figure 10:
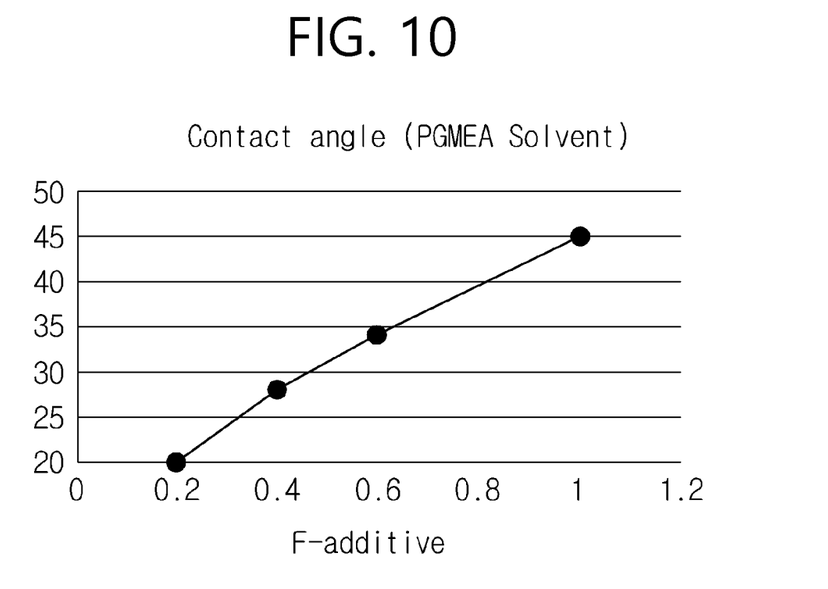

Referring to FIG. 10, if there is a large amount of a hydrophobic material (e.g., fluorine) mixed with an organic insulator for forming the hydrophobic banks 320 and 330, the hydrophobicity increases, and thus, the contact angle between the light emitting layer 220 and the hydrophobic banks 320 and 330 increases. Conversely, if there is a small amount of a hydrophobic material, the hydrophobicity decreases, and thus, the contact angle between the light emitting layer 220 and the hydrophobic banks 320 and 330 decreases. Accordingly, a relatively small amount of a hydrophobic material is mixed with the organic insulator for forming the first hydrophobic bank 320, and a relatively large amount of a hydrophobic material is mixed with the organic insulator for forming the second hydrophobic bank 330, so that the hydrophobic intensity between the hydrophobic banks 320 and 330 may be controlled. Then, the amount of the hydrophobic material disposed on a portion of the surface of the first hydrophobic bank 320 after the photolithography process becomes less than the amount of the hydrophobic material disposed on a portion of the surface of the second hydrophobic bank 330.

Figure 11:
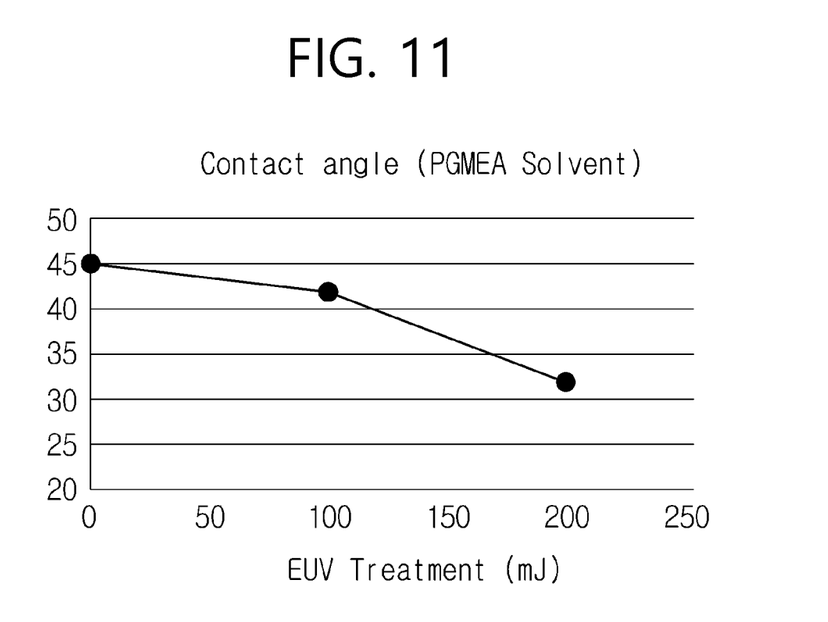

Referring to FIG. 11, in the aspect, extreme ultraviolet (EUV) lithography may be used to form the hydrophobic banks 320 and 330. In this aspect, the degree of hydrophobicity of the hydrophobic banks 320 and 330 is controlled according to the degree of the extreme ultraviolet treatment, so that the contact angle between the hydrophobic banks 320 and 330 and the light emitting layer 220 can be controlled. Accordingly, by applying a small amount of the extreme ultraviolet treatment for forming the first hydrophobic bank 320 and by applying a large amount of the extreme ultraviolet treatment for forming the second hydrophobic bank 330, the hydrophobic intensity between the hydrophobic banks 320 and 330 can be controlled.

Figure 12:
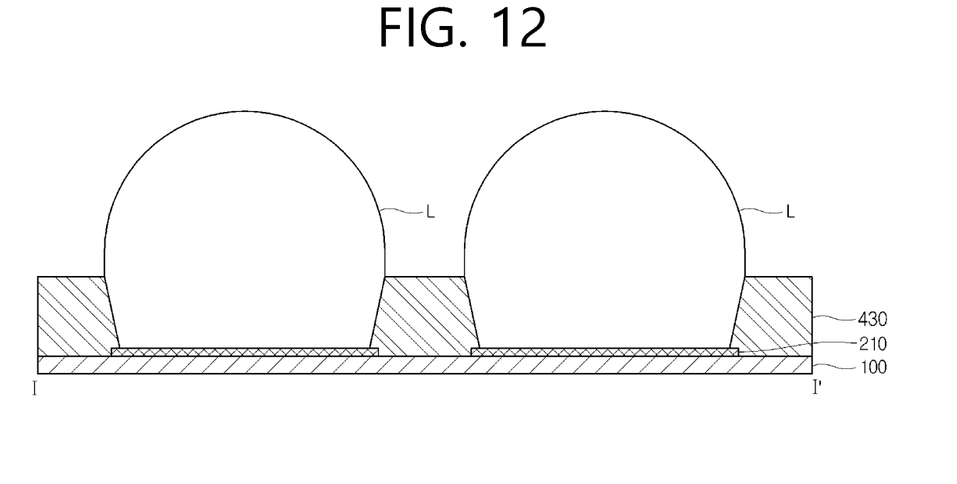
FIGS. 12 to 14 are cross-sectional views taken along line I-I' of FIG. 1 and show forms of a solution according to time in a hardening process.
Figure 13:
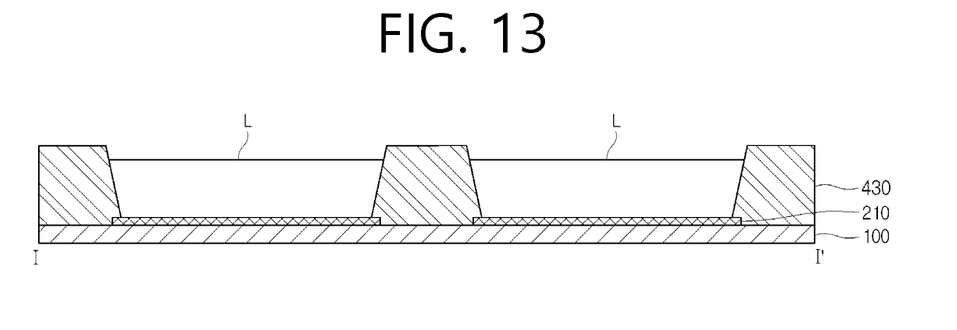
Figure 14:
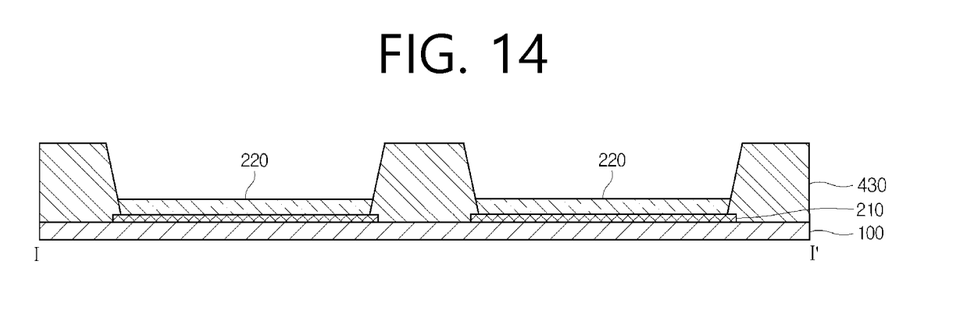

FIGS. 12 to 14 are cross sectional views taken along line I-I' of FIG. 1 and show forms of a solution according to time in a hardening process. Hereinafter, it will be described that a change in the shape of the solution according to time in the hardening process when the display panel has the shape of the bank 400 described with reference to FIGS. 5 to 7. For convenience of description, FIGS. 12 to 14 show only the second hydrophobic bank 430 and the anode electrode 210 on the substrate 100.

In the aspect, the light emitting layer 220 may be formed through a solution process. During the solution process, a solution L for forming the light emitting layer 220 may be applied along the pixel column, and the light emitting layer 220 may be formed by the hardening process of drying the applied solution L.

FIGS. 12 to 14 show a change in the shape of the solution L while the hardening process is performed. First, before the hardening process, the solution L may be applied on the display panel. The solution L may be applied to each pixel column and may be dropped on the display panel along the pixel column. The surface height of the dropped solution L is higher than the height of the second hydrophobic bank 430. However, since the second hydrophobic bank 430 having high hydrophobic properties is formed between the pixel columns, the solution L is, as shown in FIG. 12, separated from each other between the pixel columns, thereby preventing color mixing between the pixel columns.

When the pressure of the space in which the display panel is disposed is reduced during the hardening process, a solvent in the solution L may be, as shown in FIG. 13, partially evaporated and the volume of the solution L may be reduced.

When the pressure is further reduced to reach the lowest value, the solvent in the solution L is largely evaporated and only the organic material remains, so that the light emitting layer 220 is, as shown in FIG. 14, formed.

Figure 15:
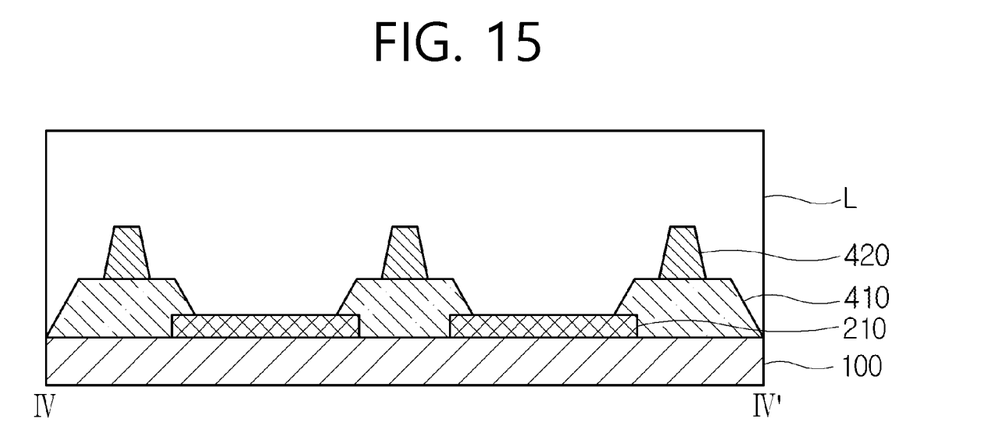
FIGS. 15 to 17 are cross-sectional views taken along line IV-IV' of FIG. 1 and show forms of a solution according to time in the hardening process.
Figure 16:
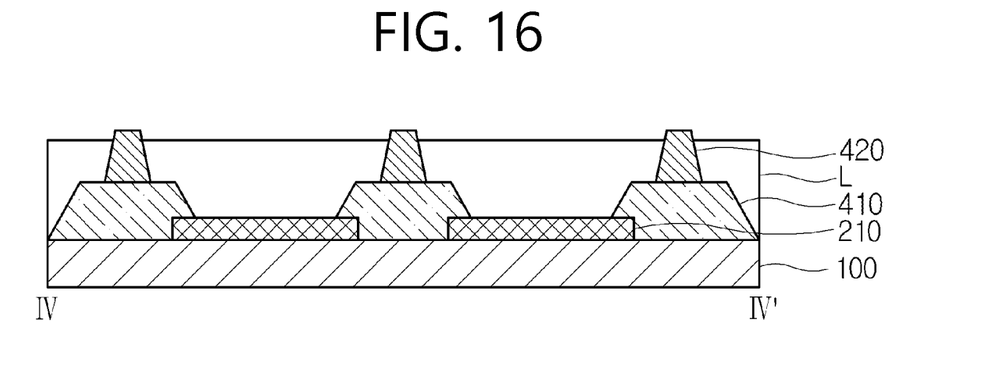
Figure 17:
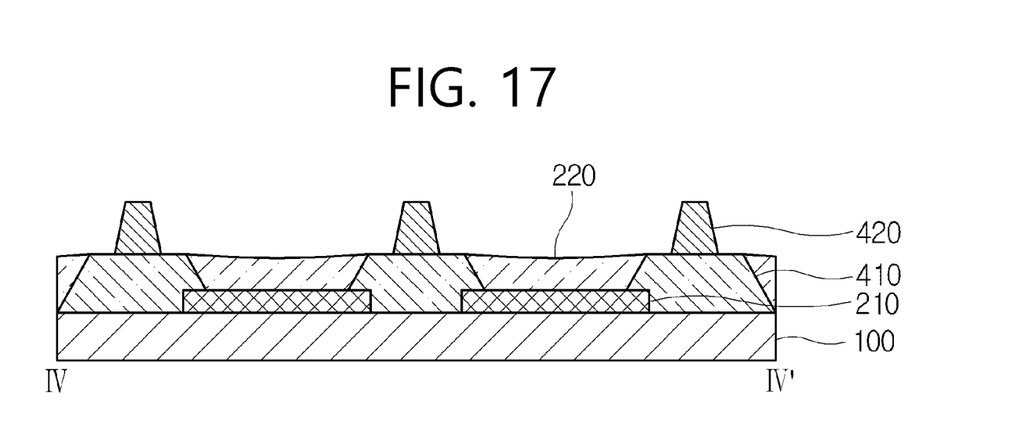
Figure 18:
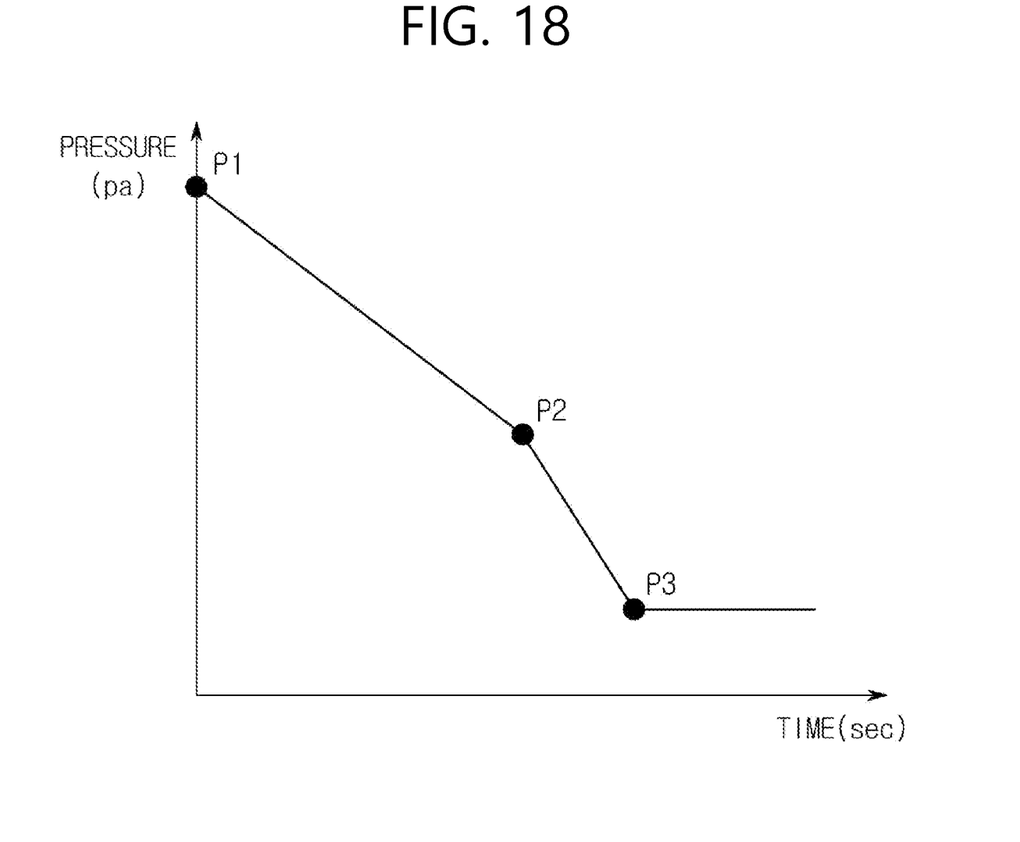
FIG. 18 is a graph showing pressure change over time in the hardening process.

FIGS. 15 to 17 are cross sectional views taken along line IV-IV' of FIG. 1 and show forms of the solution according to time in the hardening process. FIG. 18 is a graph showing pressure change over time in the hardening process.

Hereinafter, it will be described that a change in the shape of the solution according to time in the hardening process when the display panel has the shape of the bank 400 described with reference to FIGS. 5 to 7. For convenience of description, FIGS. 15 to 17 show only the second hydrophobic bank 430 and the anode electrode 210 on the substrate 100.

The light emitting layer 220 may be formed through the solution process. During the solution process, the solution L for forming the light emitting layer 220 may be applied along the pixel column, and the light emitting layer 220 may be formed by the hardening process of drying the applied solution L.

Referring to FIG. 15, before the hardening process, the solution L may be applied on the display panel. The solution L is applied to each pixel column and may be dropped on the display panel along the pixel column. The surface height of the dropped solution L is higher than the height of the banks 410 and 420.

When the pressure of the space in which the display panel is disposed is reduced during the hardening process, a solvent in the solution L may be, as shown in FIG. 16, partially evaporated and the volume of the solution L may be reduced. When the surface height of the solution L is reduced, the solution L may be, as shown in FIG. 16, separated from each other between the pixel rows by the first hydrophobic bank 410. Accordingly, the light emitting layer 220 may be formed for each light emitting area EA.

When the pressure is further reduced to reach the lowest value, the solvent in the solution L is largely evaporated and only the organic material remains, so that the light emitting layer 220 is, as shown in FIG. 17, formed.

Here, the contact angle between the light emitting layer 220 and the first hydrophobic bank 320 and the contact angle between the light emitting layer 220 and the second hydrophobic bank 330 can be controlled to be largely similar. Accordingly, the light emitting layer 220 may have a generally similar contact angle at the edge, and may have a generally symmetrical shape in the row direction X and in the column direction Y.

Referring to FIG. 18, the hardening process may be performed by a vacuum chamber dryer (VCD). Specifically, the display panel to which the solution L has been applied may be processed within the VCD. As time elapses, a pressure in the VCD may gradually decrease from an initial value P1 and reach an intermediate value P2 when a high vacuum pump TMP is controlled to be an on-state. After the high vacuum pump is controlled to be an on-state, the pressure in the VCD may further decrease and reach a lowest value P3 of a high vacuum state. As the pressure in the VCD is reduced, the solvent in the solution L applied on the display panel may evaporate and only the organic material may remain to form the light emitting layer 220.

The display panel according to the aspect can improve the luminous efficiency of the organic light emitting device by improving the surface flatness of the light emitting layer formed by a solution process.

It can be understood by those skilled in the art that the aspects can be embodied in other specific forms without departing from its spirit or essential characteristics. Therefore, the foregoing aspects and advantages are merely exemplary and are not to be construed as limiting the present disclosure. It can be understood by those skilled in the art that the aspects can be embodied in other specific forms without departing from its spirit or essential characteristics. Therefore, the foregoing aspects and advantages are merely exemplary and are not to be construed as limiting the present disclosure. The scopes of the aspects are described by the scopes of the following claims rather than by the foregoing description. All modification, alternatives, and variations derived from the scope and the meaning of the scope of the claims and equivalents of the claims should be construed as being included in the scopes of the aspects.

What is claimed is:

1. A display panel comprising:
a substrate on which a plurality of pixels are disposed;
a bank which defines a light emitting area of the plurality of pixels;
a light emitting layer disposed at the light emitting area, wherein the bank comprises:
a hydrophilic bank which extends in a row direction and separates pixel rows;
a first hydrophobic bank which is formed on the hydrophilic bank; and
a second hydrophobic bank which extends in a column direction and separates pixel columns,
wherein the first hydrophobic bank has a lower hydrophobic property than that of the second hydrophobic bank,
wherein the first hydrophobic bank and the second hydrophobic bank comprise a hydrophobic material, and
wherein an amount of the hydrophobic material of the first hydrophobic bank is less than an amount of the hydrophobic material of the second hydrophobic bank.

2. The display panel of claim 1, wherein the second hydrophobic bank is formed to cover a region of the first hydrophobic bank in a region where the first hydrophobic bank and the second hydrophobic bank cross.

3. The display panel of claim 1, wherein the hydrophilic bank and the first hydrophobic bank have a grid shape which further extends in the column direction.

4. The display panel of claim 1, wherein a surface of an edge region of the light emitting layer is formed higher than a surface of a central region of the light emitting layer.

5. The display panel of claim 4, wherein a contact angle between a surface of the light emitting layer and the first hydrophobic bank is largely similar to a contact angle between the surface of the light emitting layer and the second hydrophobic bank.

6. The display panel of claim 1, wherein a thickness of the first hydrophobic bank is less than a thickness of the second hydrophobic bank.

7. The display panel of claim 1, wherein the first hydrophobic bank and the second hydrophobic bank are made of an organic insulator and comprise the hydrophobic material disposed on a portion of a surface thereof.

8. A manufacturing method of the display panel, the manufacturing method comprising:
forming a hydrophilic bank which extends on a substrate in a row direction and separates pixel rows;
forming a first hydrophobic bank on the hydrophilic bank; and
forming a second hydrophobic bank which extends in a column direction and separates pixel columns,
wherein the first hydrophobic bank has a lower hydrophobic property than that of the second hydrophobic bank,
wherein the forming the first hydrophobic bank and the forming the second hydrophobic bank comprise applying a solution in which a hydrophobic material is mixed with a hydrophilic organic insulator, and drying the solution, and
wherein an amount of the hydrophobic material of the solution for forming the first hydrophobic bank is less than an amount of the hydrophobic material of the solution for forming the second hydrophobic bank.

9. The manufacturing method of claim 8, wherein the forming the hydrophilic bank further comprises forming, in the form of a grid, the hydrophilic bank which further extends in the column direction.

10. The manufacturing method of claim 8, wherein the drying the solution is performed by a photolithography process, and
wherein an amount of light which is irradiated in the photolithography process for forming the first hydrophobic bank is less than an amount of light which is irradiated in the photolithography process for forming the second hydrophobic bank.

11. The manufacturing method of claim 8, wherein a thickness of the first hydrophobic bank is less than a thickness of the second hydrophobic bank.

12. The manufacturing method of claim 8, wherein the drying the solution is performed by an extreme ultraviolet treatment, and wherein a degree of the extreme ultraviolet treatment for forming the first hydrophobic bank is less than a degree of the extreme ultraviolet treatment for forming the second hydrophobic bank.

13. The manufacturing method of claim 8, further comprising:
applying a solution of a mixture of a solvent and an organic material on a light emitting area surrounded by the first hydrophobic bank and the second hydrophobic bank; and
forming a light emitting layer by hardening the solution.

14. The manufacturing method of claim 13, wherein the solution is continuously applied along each of the pixel columns while covering the first hydrophobic bank, and is separated from each other between the pixel columns by the second hydrophobic bank.

15. The manufacturing method of claim 14, wherein a height of a surface of the solution is reduced as the solution is hardened, so that the solution is separated from each other between the pixel rows by the first hydrophobic bank.

16. The manufacturing method of claim 15, wherein, after the solution is hardened, a contact angle between a surface of the light emitting layer and the first hydrophobic bank is largely similar to a contact angle between the surface of the light emitting layer and the second hydrophobic bank.

17. A display panel comprising:
a plurality of pixels defined on a substrate;
a hydrophilic bank extended in a first direction;
a first hydrophobic bank disposed on the hydrophilic bank and extended in the first direction;
a second hydrophobic bank disposed on the hydrophilic bank and first hydrophobic bank and extended in a second direction that is perpendicular to the first direction; and
a light emitting layer disposed at the light emitting area and having an edge region thicker than a central region,
wherein the first hydrophobic bank has a hydrophobic property lower than that of the second hydrophobic bank,
wherein the first hydrophobic bank and the second hydrophobic bank comprise a hydrophobic material, and
wherein an amount of the hydrophobic material of the first hydrophobic bank is less than an amount of the hydrophobic material of the second hydrophobic bank.

18. The display panel of claim 17, wherein each of the hydrophilic bank, the first hydrophobic bank and the second hydrophobic bank has a top surface smaller than a bottom surface.

* * * * *